United States Patent
Kawashima et al.

(10) Patent No.: US 8,502,962 B2
(45) Date of Patent: Aug. 6, 2013

(54) COMPUTER READABLE STORAGE MEDIUM INCLUDING EFFECTIVE LIGHT SOURCE CALCULATION PROGRAM, AND EXPOSURE METHOD

(75) Inventors: Miyoko Kawashima, Haga-gun (JP); Kenji Yamazoe, Utsunomiya (JP); Hironobu Fujishima, Utsunomiya (JP)

(73) Assignee: Canon Kabushiki Kaisha (JP)

(*) Notice: Subject to any disclaimer, the term of this patent is extended or adjusted under 35 U.S.C. 154(b) by 243 days.

(21) Appl. No.: 12/945,775

(22) Filed: Nov. 12, 2010

(65) Prior Publication Data

US 2011/0122394 A1  May 26, 2011

(30) Foreign Application Priority Data

Nov. 20, 2009 (JP) ................................. 2009-265530
Oct. 26, 2010 (JP) ................................. 2010-240106

(51) Int. Cl.
*G03B 27/32* (2006.01)
*G03B 27/54* (2006.01)
*G03B 27/72* (2006.01)
*G03F 7/20* (2006.01)

(52) U.S. Cl.
CPC ........ *G03F 7/70091* (2013.01); *G03F 7/70508* (2013.01)
USPC .................................. 355/77; 355/67; 355/71

(58) Field of Classification Search
CPC .............. G03F 7/70091; G03F 7/70058; G03F 7/70133; G03F 7/705; G03F 7/70125; G03F 7/70508
USPC ...................... 355/53, 67, 71, 77; 716/51, 53
See application file for complete search history.

(56) References Cited

U.S. PATENT DOCUMENTS

| | | | |
|---|---|---|---|
| 5,455,632 A | 10/1995 | Ichihara | |
| 5,465,220 A | 11/1995 | Haruki et al. | |
| 5,607,821 A | 3/1997 | Haruki et al. | |
| 5,774,222 A * | 6/1998 | Maeda et al. | ................. 356/394 |
| 6,045,976 A | 4/2000 | Haruki et al. | |

(Continued)

FOREIGN PATENT DOCUMENTS

| | | |
|---|---|---|
| JP | 6-120119 A | 4/1994 |
| JP | 2002-334836 A | 11/2002 |
| JP | 2004-128108 A | 4/2004 |
| JP | 2008-040470 A | 2/2008 |

OTHER PUBLICATIONS

"Interference and diffraction with partially coherent light," Principles of Optics, Cambridge University Press, 1999, 7th (extended) edition, pp. 554-632. Cited in spec. Previously submitted Nov. 12, 2010.

*Primary Examiner* — Steven H Whitesell Gordon

(74) *Attorney, Agent, or Firm* — Rossi, Kimms & McDowell LLP

(57) ABSTRACT

A storage medium includes a program which causes a computer to execute a method of calculating a light intensity distribution on a pupil plane of an illumination optical system. The method includes: determining an impulse response function of a projection optical system by performing Fourier transform on a pupil function of the projection optical system; setting a length to a second zero point of the impulse response function as a response length, extracting, from elements forming a target pattern, only elements inside am area within radius which is response length, and determining a function indicating the extracted pattern as an image function; and obtaining the light intensity distribution based on the pupil function, the determined impulse response function, and the determined image function.

11 Claims, 10 Drawing Sheets

U.S. PATENT DOCUMENTS

| | | |
|---|---|---|
| 6,420,094 B1 | 7/2002 | Haruki et al. |
| 6,871,337 B2 | 3/2005 | Socha |
| 6,999,160 B2 | 2/2006 | Sakai |
| 7,921,383 B1 * | 4/2011 | Wei .................................. 716/54 |
| 2005/0185159 A1 * | 8/2005 | Rosenbluth et al. ............ 355/53 |
| 2008/0052334 A1 | 2/2008 | Yamazoe |

* cited by examiner

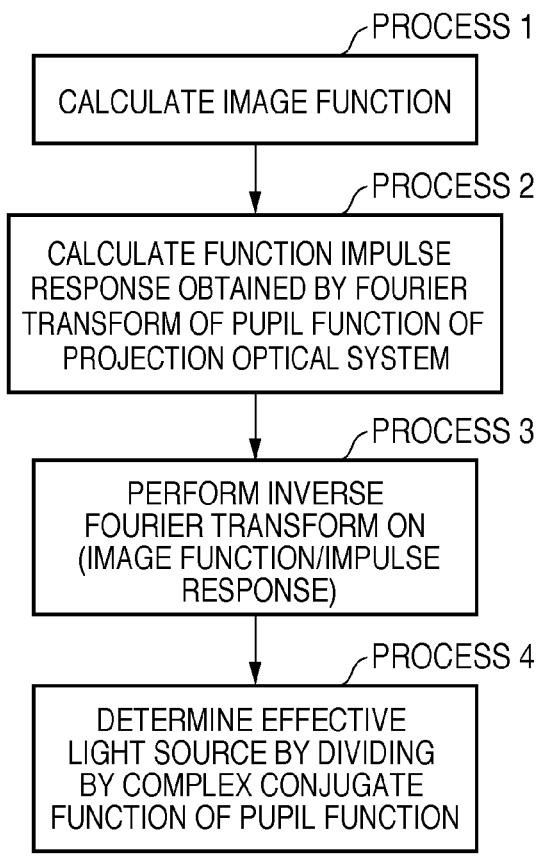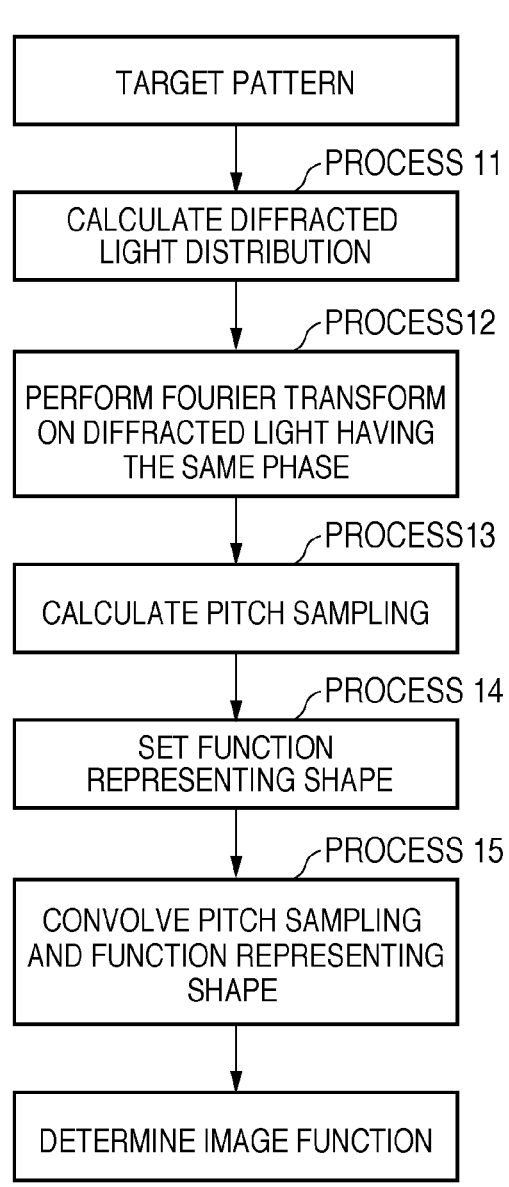

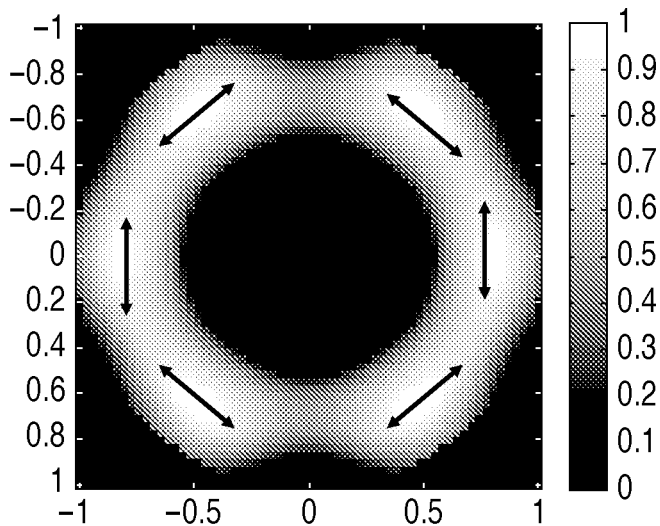
FIG. 6A
FIG. 6B
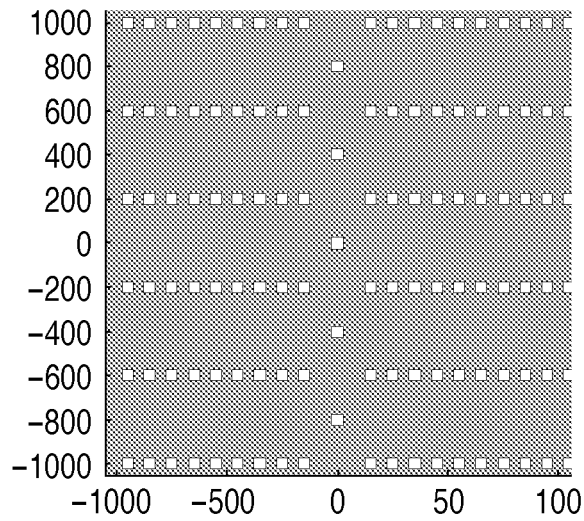
FIG. 6C
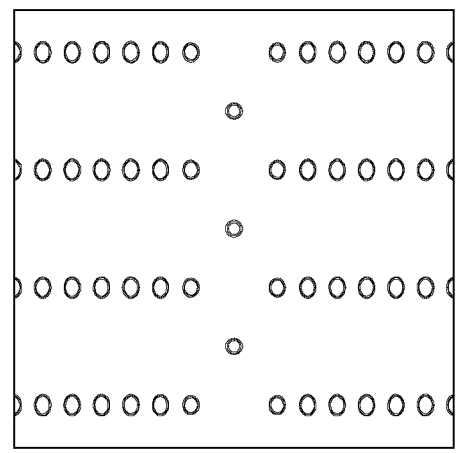
FIG. 6D
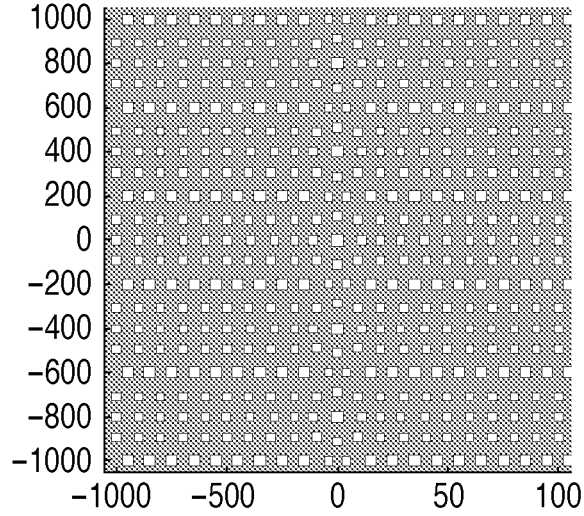
FIG. 6E
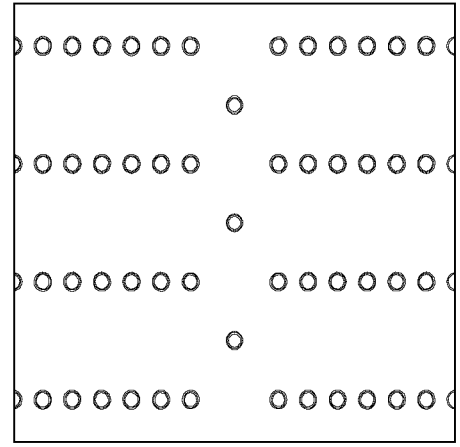

FIG. 7A
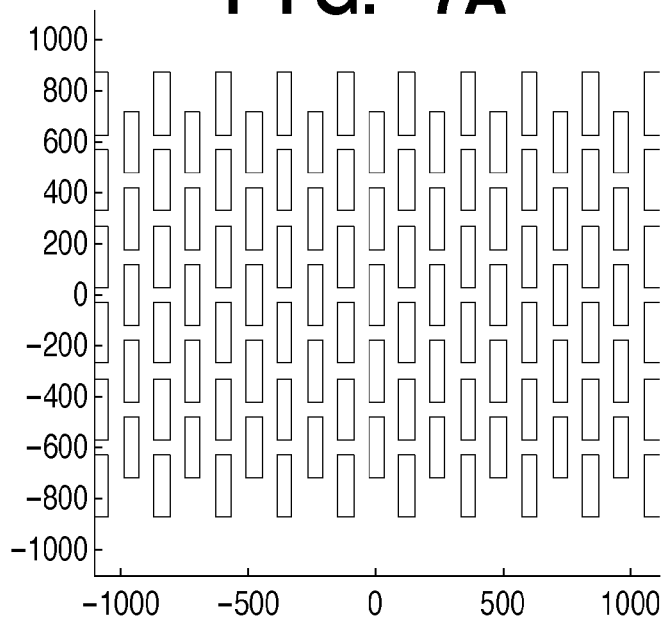
FIG. 7B
FIG. 7C
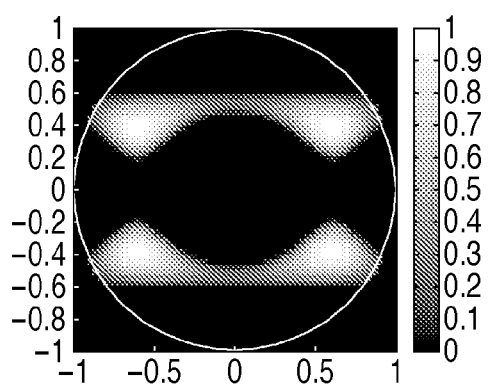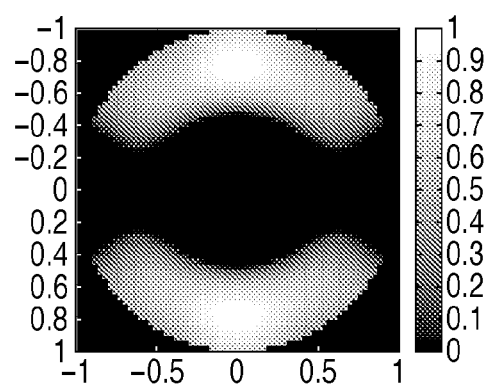
FIG. 7D
FIG. 7E
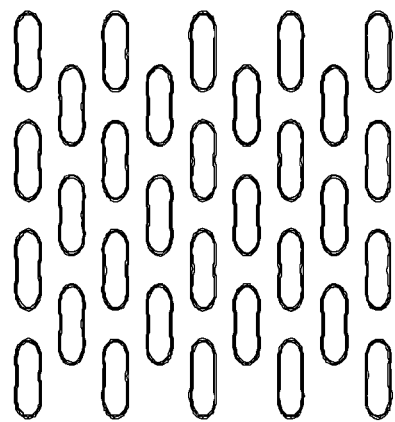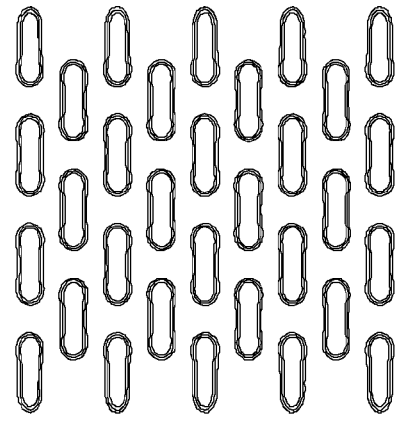

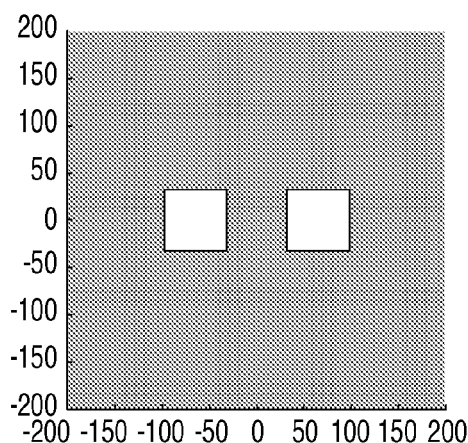
FIG. 9A
FIG. 9B
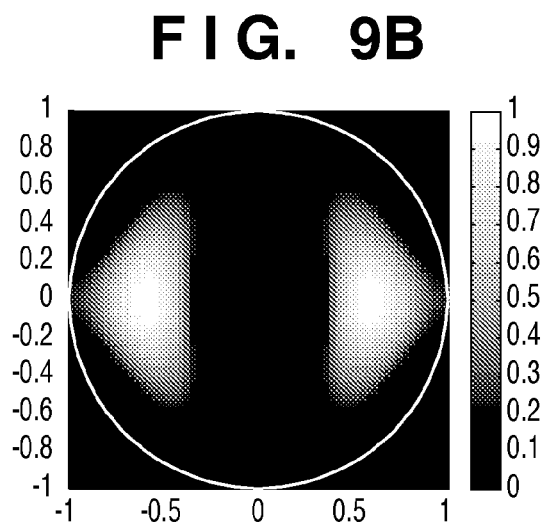
FIG. 9C
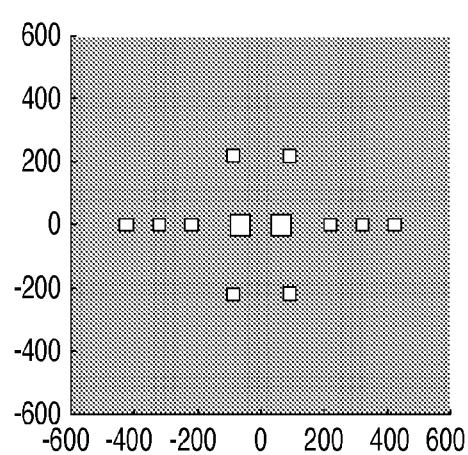
FIG. 9D
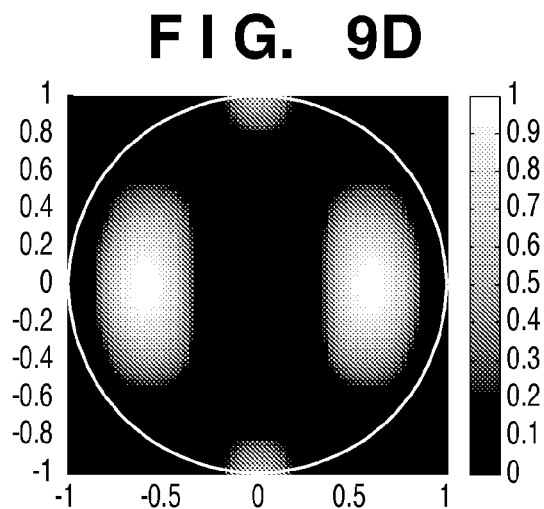
FIG. 9E
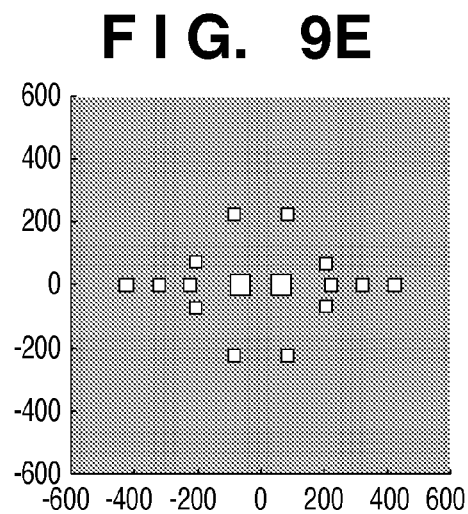

COMPUTER READABLE STORAGE MEDIUM INCLUDING EFFECTIVE LIGHT SOURCE CALCULATION PROGRAM, AND EXPOSURE METHOD

BACKGROUND OF THE INVENTION

1. Field of the Invention

The present invention relates to a computer readable storage medium including an effective light source calculation program, and an exposure method.

2. Description of the Related Art

An exposure apparatus has conventionally been used when manufacturing fine semiconductor devices such as semiconductor memories and logical circuits by using the photolithography technique. The exposure apparatus projects a pattern (circuit pattern) drawn on a mask (reticle) as an original onto a substrate such as a wafer by using a projection optical system, thereby transferring the pattern onto the substrate. Recently, the micropatterning techniques for semiconductor devices have advanced, and the exposure apparatus is required to form patterns having dimensions smaller than the exposure wavelength (the wavelength of exposure light). In the formation of fine patterns like these, the image quality is affected by the illumination condition (effective light source) used to illuminate the mask. This makes it important to set an optimum effective light source.

Accordingly, a trial and error method is generally used where the best effective light source is selected among a plurality of possible ones by evaluating each corresponding optical images (aerial images). However, this method requires time and labor. Therefore, a deterministic method of the effective light source is desirable. Generally, the determination of an effective light source requires the calculation of many optical images. For example, an effective light source is two-dimensionally divided into a plurality of elements, and these elements are regarded as point light sources. Then, an optical image attributed to each point light source is calculated, and the point light sources contributing to faithful realization of the original pattern are adapted. In this way, an effective light source can be optimized. The optimization scheme of an effective light source like this is disclosed in Japanese Patent Laid-Open Nos. 6-120119, 2002-334836, and 2004-128108. However, since this method must calculate many optical images (aerial images), it takes an enormous time to determine the effective light source.

SUMMARY OF THE INVENTION

The present invention calculates an effective light source within a short time without performing any time-consuming calculation of image formation. Furthermore, the present invention calculates an effective light source so as to reduce a decrease in image formation performance in a case including an aberration as compared with a case including no aberration.

According to one aspect of the present invention, there is provided a computer readable storage medium comprising a program which causes a computer to execute a method of calculating a light intensity distribution to be formed on a pupil plane of an illumination optical system in an exposure apparatus which illuminates an original with light emitted from the illumination optical system, and exposes a substrate by projecting a pattern of the illuminated original onto the substrate via a projection optical system, the method comprising steps of: determining an impulse response function of the projection optical system through a process of performing Fourier transform on a pupil function of the projection optical system; setting a length to a second zero point of the impulse response function from the origin as a response length, extracting, from elements forming a target pattern to be formed on the substrate, only elements inside an area within radius which is response length, and determining a function indicating the extracted pattern as an image function; and obtaining the light intensity distribution to be formed on the pupil plane of the illumination optical system based on the pupil function, the determined impulse response function, and the determined image function.

Further features of the present invention will become apparent from the following description of exemplary embodiments with reference to the attached drawings.

BRIEF DESCRIPTION OF THE DRAWINGS

FIGS. 1A and 1B are flowcharts of a method of determining an effective light source;

FIGS. 6A to 6E are views showing an illumination light source, a mask pattern, and a two-dimensional image obtained by using the mask pattern according to the second embodiment;

FIGS. 7A to 7E are views showing a target pattern, a determined effective light source, and the two-dimensional image of an aerial image obtained by using the effective light source;

FIGS. 9A to 9E are exemplary views showing a target pattern, an effective light source distribution, and a mask pattern obtained from the determined effective light source according to the fourth embodiment.

DESCRIPTION OF THE EMBODIMENTS

Figure 2A:
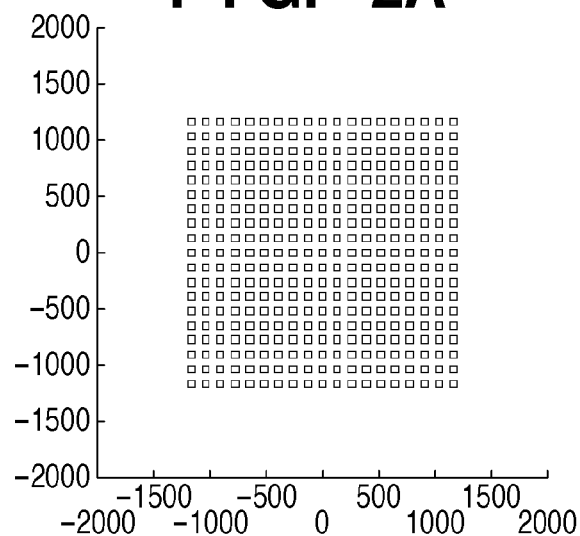
FIGS. 2A to 2E are exemplary views showing a target pattern, image function, impulse response, and determined effective light source.

The present invention is applicable when manufacturing various kinds of devices, for example, semiconductor chips such as an IC and LSI, display devices such as a liquid crystal panel, detection devices such as a magnetic head, and image sensing devices such as a CCD, and generating original data (a mask pattern) for use in micromechanics. Micromechanics herein mentioned is the technique of forming a micron-order machine system having an advanced function by applying the semiconductor integrated circuit fabrication techniques to the manufacture of microstructures, or the machine system itself. The present invention is usable as, for example, a method of determining an effective light source for illuminating original data (a mask pattern) for use in an exposure apparatus including a projection optical system having a large numerical aperture (NA), or an immersion exposure apparatus in which the space between a projection optical system and wafer is filled with a liquid.

Embodiments of the present invention will be explained below with reference to the accompanying drawings. Note that the same reference numerals denote the same parts in these drawings, and a repetitive explanation will be omitted. In an exposure apparatus, according to the partial coherent imaging theory, an aerial image on the wafer plane can be calculated. Partial coherent image formation requires the information of an effective light source. The coherence herein mentioned is the degree of interference depending to the distance on the mask surface, and means a so-called spatial coherence. Also, the effective light source is a light intensity distribution formed on the pupil of a projection optical system when there is no mask. That is, determining the effective light source is to calculate the light intensity distribution to be formed on the pupil plane of an illumination optical system.

The coherency of the effective light source is incorporated in a TCC (Transmission Cross Coefficient). The TCC is defined on the pupil plane of a projection optical system, and represents an overlapped area of the effective light source, a pupil function of the projection optical system, and a complex conjugate of the pupil function of the projection optical system. Letting (f,g) be coordinates on the pupil plane of the projection optical system, S(f,g) be a function expressing the effective light source, and P(f,g) be the pupil function, the TCC can be represented by:

$$TCC(f',g',f'',g'') = \iint S(f,g) P(f+f',g+g') P^*(f+f'',g+g'') df dg \quad (1)$$

where *" represents the complex conjugate, and the integral range is $-\infty$ to $\infty$.

The pupil function is a function representing the pupil plane of the projection optical system, and has information such as the shape, size, and aberration of the pupil. The aberration of the projection optical system, the polarization of illumination light, resist information, and the like can be incorporated in the pupil function P(f,g). In this specification, therefore, a simple description "pupil function" sometimes includes the polarization, aberration, and resists information. As indicated by equation (1), the TCC is originally a four-dimensional function. In this specification, however, this four-dimensional function will simply be abbreviated as TCC in some cases. A function I(x,y) representing an aerial image can be given by using the TCC, quadruple integral by equation (2) by using a function a(f,g) expressing the spectral distribution (diffracted light distribution) of a mask pattern on the pupil plane of the projection optical system. The diffracted light distribution a(f,g) of the mask pattern is a function F(m(x,y)) obtained by performing Fourier transform on a function m(x,y) expressing the mask pattern. Note that in equation (2), * represents the complex conjugate and the integral range is $-\infty$ to $\infty$. M. Born, E. Wolf, "Principles of Optics", Cambridge University Press, 1999, 7th (extended) edition, p. 554-632 explains a detailed explanation of equation (2).

$$I(x,y) = \iiiint TCC(f',g',f'',g'') a(f',g') a^*(f'',g'') \times \exp\{-i2\pi [(f'-f'')x+(g'-g'')y]\} df'dg'df''dg'' \quad (2)$$

Equations (3) and (4) are obtained by representing equation (2), that is, the function I(x,y) expressing an aerial image, by discretized variables, and deforming the function. In equation (4), $F^{-1}$ represents inverse Fourier transform.

$$I(x,y) = \sum_{f',g'} Y_{f',g'}(x,y) \quad (3)$$

$$Y_{f',g'}(x,y) = \quad (4)$$
$$a(f',g')\exp[-i2\pi(f'x+g'y)] \times F^{-1}[W_{f',g'}(f'',g'')a^*(f'',g'')]$$

$W_{f',g'}(f'',g'')$ is defined by equation (5) with respect to certain fixed coordinates (f',g').

$$W_{f',g'}(f'',g'') = TCC(f',g',f'',g'') \quad (5)$$

Since Fourier transform and inverse Fourier transform are sometimes interchangeably used, the expression can be altered as follows.

In addition, $Y_{f',g'}(x,y)$ can be described by equation (6) below by changing the sequence of addition.

$$Y_{f',g'}(x,y) = a^*(f',g')\exp[i2\pi(f'x+g'y)] \times F[W_{f',g'}(f'',g'')a(f'',g'')] \quad (6)$$

$Y_{f'',g''}(x, y)$ is called an approximate aerial image. When (f',g')=(0,0), the pupil function of the projection optical system and the effective light source overlap each other. Therefore, $W_{0,0}(f'',g'')$ obviously has the largest effect among all two-dimensional transmission cross coefficients.

The effective light source can be determined by using equations (5) and (6). Assuming that the coordinates of the pupil plane (f'',g'') is rewritten to (f,g), the pupil function is P(f,g), and the image function is r(x,y) the effective light source S(f, g) can be expressed by following formula 7 or 8. Since the phase of the pupil function is taken into consideration, a case including an aberration can be processed.

$$S(f,g) = 1/P(f,g) \times F[r^*(x,y)/F[P^*(f,g)]] \quad (7)$$

$$S(f,g) = 1/P^*(f,g) \times F^{-1}[r(x,y)/F[P(f,g)]] \quad (8)$$

An image function r(x,y) representing an image on the image plane of the projection optical system is defined as follows. Solving equations (5) and (6) yields equation (9), so the image function can be obtained mathematically as follows:

$$r(x, y) = F\left[\frac{1}{a(f, g)} F^{-1}\left[\frac{I(x, y)}{F[a(f, g)]}\right]\right] \quad (9)$$

The image function r(x,y) represented by equation (9) uses the approximate aerial image I(x,y) and the diffracted light distribution a(f,g). F[p(f,g)] as the impulse response of the projection optical system determines the range within which the approximate aerial image has an effective value. Letting $\lambda$ be the wavelength of light (light illuminating an original) passing through the projection optical system and NA be the numerical aperture of the projection optical system, the approximate aerial image is effective inside the area. The length from the origin to the second zero point of F[p(f,g)] is about $(7.016 \,(\lambda/\text{NA})/(2\pi))$, that is about $1.12 \,(\lambda/\text{NA})$. Accordingly, the effective range of the image function r(x,y) is $1.12 \,(\lambda/\text{NA})$ or less. Although this length more or less changes if there is an aberration, this length is regarded as the response length. The effective light source S(f,g) is a light source for resolving the image function r(x,y). That is, this method obtains a light source that resolves the pattern inside a distance equal to or smaller than the response length. Also, the effective light source must, of course, be larger than $0.5 \,(\lambda/\text{NA})$ as the range within which the optical system can be resolved.

If a minimum structure can be resolved in the relative positional relationship of a target pattern, the whole target pattern can be resolved. When the target pattern is a periodic pattern, it is only necessary to consider a minimum unit structure within the range equal to or smaller than the response length. Even for a general pattern including a plurality of periodicities, the image function r(x,y) need only be considered by extracting a pattern near the above-mentioned effective range.

In equation (9), the approximate aerial image I(x,y) cannot accurately be obtained if no light source is determined. However, the image function can also be obtained by assuming that the approximate aerial image I(x,y) is equal to a target pattern itself or a partial image of the target pattern. Furthermore, it is in practice necessary to obtain the diffracted light distribution of a mask pattern as the diffracted light distribution a(f,g). However, the image function is obtained by assuming that the diffracted light distribution a(f,g) is equal to the diffracted light distribution of a target pattern. Practical methods of calculating the image function will be explained below.

[First Calculation Method of Image Function]

In the first method, it is assumed that the image function r(x,y) is a minimum unit of a target pattern in the relative positional relationship of the whole target pattern. More specifically, only elements for each of which the spacing to an adjacent element is equal to or smaller than the response length are extracted from elements forming the target pattern, and a function indicating the extracted pattern is determined as the image function. When the target pattern is a periodic pattern having only one periodicity, the effective light source S(f,g) can be determined by using the image function determined by this method, instead of the image function r(x,y) of equation (9).

[Second Calculation Method of Image Function]

In the first method, it should be noted that the pattern spacing in a target pattern is not always limited to one period in respect of the pattern periodicity. This is so because the pattern spacing includes an n-fold (n is a positive integer) period. Since the pattern periodicity can be expressed by a frequency space, a minimum periodic structure is found if the diffracted light distribution is obtained. However, even when the diffracted light distribution is converted into the periodicity on the image plane by Fourier transform, the minimum periodic structure disappears because the positive and negative diffracted light components cancel each other. Therefore, diffracted light components having the same phase are extracted, and Fourier transform is performed by including up to a region of 2NA/λ, thereby obtaining the periodicity so as not to cancel the minimum periodic structure on the image plane. An aerial image of adjacent pattern elements extracted within the above-mentioned range is defined as the image function (x,y). The second method is obtained by extending the first method to an arbitrary pattern.

The second calculation method of the image function will be explained below with reference to FIG. 1B. Information to be input to a computer for calculating the image function includes the whole or a part of target pattern data, the wavelength λ of the exposure light, and the numeral aperture NA of the projection optical system. The computer calculates the pattern periodicity based on the input information. First, in process 11, the computer calculates the diffracted light distribution of the target pattern. Then, in process 12, the computer extracts frequency components having the same phase within the range twice as large as the pupil radius, and performs Fourier transform on the extracted frequency components. In process 12, the computer extracts only frequency components equal to or larger (or smaller) than a certain value, in order to extract frequency components having the same phase. In process 13, from the image having performed Fourier transform, the computer obtains peak positions within the range enclosed with a circle centering around the optical axis of the projection optical system and having a diameter equal to or smaller than the response length, that is, about 1.12×(λ/NA) (pitch sampling). In process 14, the computer sets a function representing the shape of elements forming the target pattern. The function representing the shape can be a function representing the shape itself of an element of the target pattern, and can also be a function obtained by approximating the shape of an element of the target pattern by a function such as the Gaussian distribution. It is also possible to define the function representing the shape from an intensity distribution obtained by the calculation of image formation by using a light source, in which an element of the target pattern is preset, and the wavelength and numerical aperture of the projection optical system. In process 15, the computer convolves the function set in process 14 and representing the shape of an element of the target pattern, into each point of the peak position extracted in process 13, and adds up all the peak position points, thereby calculating the image function.

[Third Calculation Method of Image Function]

In the third method, a computer calculates the image function by equation (9) by letting I(x,y) be the aerial image of a target pattern and a(f,g) be the diffracted light distribution of the target pattern, around the optical axis of the projection optical system. More specifically, the computer calculates the image function r(x,y) by substituting the image I(x,y) of the target pattern and the diffracted light distribution a(f,g) of the target pattern into the right side of $$r(x, y) = F\left[\frac{1}{a(f, g)} F^{-1}\left[\frac{I(x, y)}{F[a(f, g)]}\right]\right]$$

The image function r(x,y) has a value in only the range enclosed with a circle centering around the optical axis of the projection optical system and having a diameter equal to or smaller than the response length, that is, about 1.12×(λ/NA), and is replaced by zero in a position larger than the response length. In this case, there is instability that these settings change the obtained effective light source. However, the second and third image function calculation methods are widely generalized methods for arbitrary patterns.

[Determination of Effective Light Source]

FIG. 1A is a schematic block diagram showing a method of calculating a light intensity distribution to be formed on the pupil plane of an illumination optical system, that is, a method of determining the effective light source. A program causes a computer to execute the method. The method of determining the effective light source shown in FIG. 1A is based on equation (8). In process 1, the computer calculates the image function by using the first to third methods described above. In process 2, the computer performs Fourier transform on the pupil function of the projection optical system. The function obtained by Fourier transform of the pupil function is the impulse response (impulse response function) of the projection optical system. The length to the second zero point of the impulse response from the origin is obtained as the response length. In process 2, the computer converts the coordinates on the pupil plane into the coordinates on the image plane of the projection optical system, it is multiplied by 1/(NA/λ). Also, in process 2, the computer replaces a nonzero finite value at a point at which impulse response is a zero.

In process 3, the computer performs a division process to divide the image function calculated in process 1 by the impulse response calculated in process 2, and performs inverse Fourier transform on the function having performed the division process. In process 4, the computer performs a division process to divide the function having performed inverse Fourier transform in process 3 by the complex conjugate function of the pupil function, thereby obtaining the effective light source. That is, in process 4, the computer takes the real part of the distribution obtained by process 3, and replaces all negative intensities with zeros. Note that a light source distribution exceeding the ratio of the NAs of the illumination optical system to the NA of the projection optical system may be replaced with zero. Note also that the division process need only perform a division as a result, and therefore, includes performing a division process in an arithmetic circuit of the computer, for example, a bit shift by the arithmetic circuit. The same applies to the following explanation.

Figure 2C:
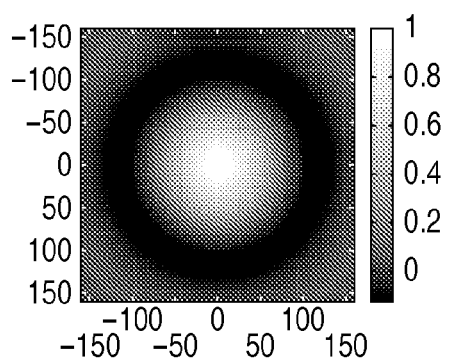
Figure 2B:
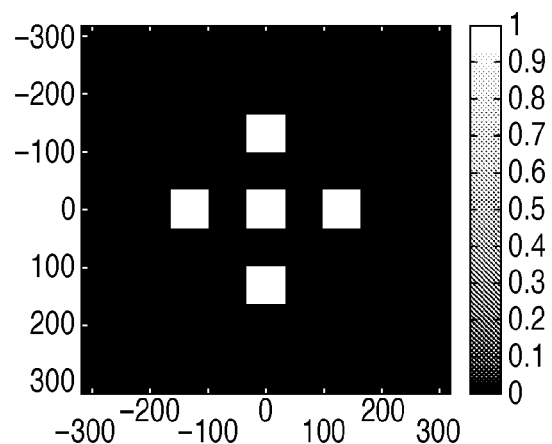
Figure 2D:
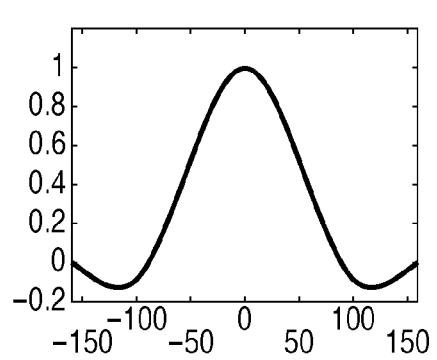
Figure 2E:
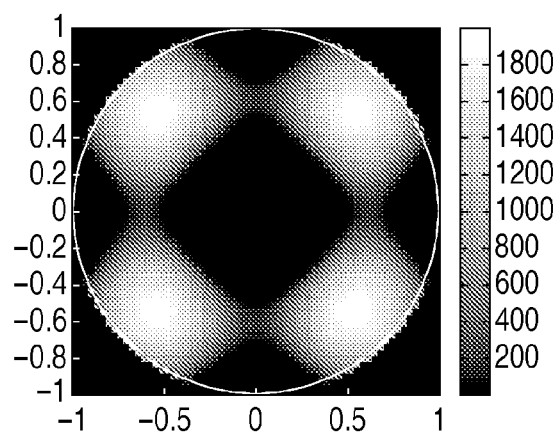

The explanation will be made by taking a pattern as shown in FIG. 2A as an example. Assume that the wavelength $\lambda$ of ArF for illuminating an original is 193 nm, the NA of the projection optical system is 1.35, the central distance (pitch) between elements of a target pattern is 130 nm, and the dimension of one side of each target pattern element is 65 nm. The response length is about 160 nm. FIG. 2B shows the image function calculated by the computer by extracting target pattern elements for which the spacing between the central positions of the elements is 160 nm or less, by using the first calculation method of the image function in process 1. The impulse response of the projection optical system calculated by the computer in process 2 is as shown in FIGS. 2C and 2D. FIG. 2C shows the two-dimensional intensity distribution of the impulse response of the projection optical system. FIG. 2D shows the one-dimensional section of FIG. 2C. In processes 3 and 4, the computer obtains an effective light source as shown FIG. 2E. In this case, the ratio of the NAs of the illumination optical system to the NA of the projection optical system was 1. Thus, as a light source suited to the target pattern as shown in FIG. 2A, the effective light source distribution as shown in FIG. 2E, that is, a quadrupole illumination distribution is obtained. This result matches a well-known illumination distribution. It is also possible to form mask pattern data from the light source thus obtained and the target pattern. The mask pattern formation method is disclosed in Japanese Patent Laid-Open No. 2008-040470.

Details of the above-mentioned processes will be explained below with reference to the first to third embodiments. In all the first to third embodiments, the NA of a projection optical system of an exposure apparatus is 1.35, and the wavelength of exposure light is 193 nm. Also, the projection optical system has no aberration, and a resist with which a substrate (wafer) is coated is not taken into consideration. That is, as the information of the exposure apparatus, the NA information of the projection optical system is 1.35, the $\lambda$ information of the exposure light is 193 nm, the aberration information is no aberration, and no resist information is taken into account. Also, the length of a mask pattern is represented by the length on the image plane multiplied by the magnification of the projection optical system. All light sources are indicated by effective light sources on the pupil, and the radius of the pupil is 1. Furthermore, the NA ratio of the projection optical system to an illumination optical system will always be 1 hereinafter. A half pitch HP (nm) of a target pattern will be normalized by the exposure light wavelength $\lambda$ (nm) and the NA, and represented by k1=HP (nm)/($\lambda$(nm)/NA).

[First Embodiment]

Figure 3A:
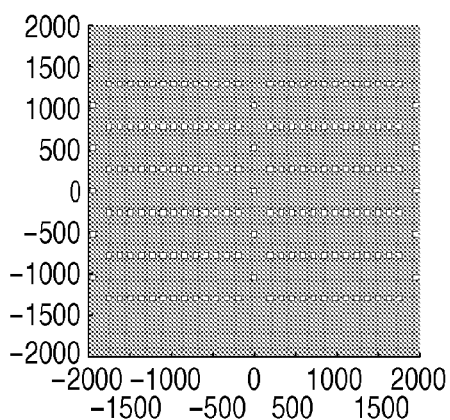
FIGS. 3A to 3F are views showing a target pattern, image function, and determined effective light source according to the first embodiment.

The first embodiment of a method of determining an effective light source will be explained below with reference to FIGS. 3A to 3F. FIG. 3A shows a target pattern to be formed on a substrate. Assume that the minimum half pitch HP of the target pattern is 65 (nm). When normalized by exposure light wavelength $\lambda$=193 (nm) and NA=1.35, the target pattern half pitch is k1=0.45. A mask was assumed to be a halftone phase-shift mask, the transmittance of the pattern was 100%, and that of the periphery of the pattern was 6%. A phase difference between the pattern and the periphery of the pattern is $\pi$ (rad). In the target pattern, dense holes and isolated holes are arranged in the lateral direction. The target pattern is not a simple periodic pattern but includes the isolated holes, and this makes it difficult to balance the sizes of the isolated holes and dense holes. The ordinate and abscissa of FIG. 3A showing the pattern are indicated by a length (nm) converted into the length on the image plane. In all the drawings, the abscissa is the X-axis, and the ordinate is the Y-axis.

Figure 3B:
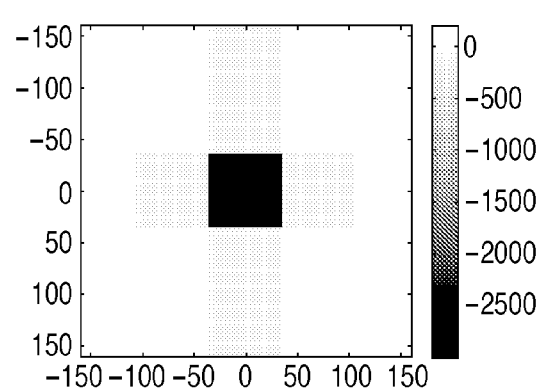
Figure 3C:
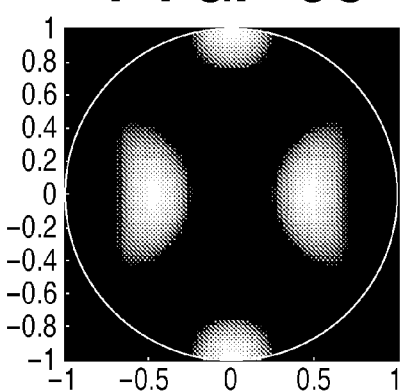

FIG. 3B shows the distribution of the image function obtained by the third image function calculation method using equation (9). FIG. 3C shows an effective light source derived by applying this image function and the impulse response of the projection optical system as shown in FIGS. 2C and 2D to equation (8) (or (7)), and suited to resolve the target pattern.

Next, a method of obtaining the image function and a method of obtaining the effective light source will be explained below. The image function was calculated by equation (9) by using the target pattern itself as an approximate aerial image, and a diffracted light distribution obtained from the target pattern. FIGS. 2C and 2D illustrate the impulse response obtained by Fourier transform of the pupil function. When the pupil is circular and has no aberration, a Bessel function is obtained by Fourier transform of the pupil function. FIG. 2C shows the two-dimensional distribution of the impulse response. FIG. 2D shows the one-dimensional section of the impulse response. A point at which the impulse response is zero is replaced with a nonzero finite value. In this way, the image function distribution as shown in FIG. 3B is obtained. The calculated image function is divided by the impulse response, inverse Fourier transform is performed on the divided function, and the result is divided by the complex conjugate function of the pupil function, thereby obtaining an effective light source. Thus, the effective light source as shown in FIG. 3C was obtained.

Figure 3D:
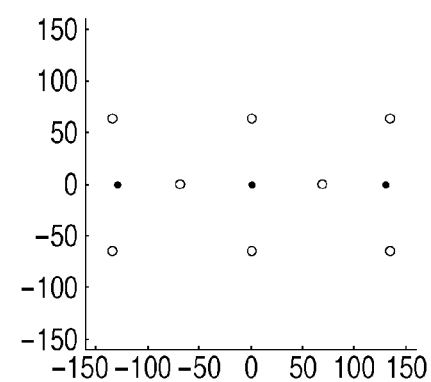

Then, the effective light source is obtained by deriving the image function by the second calculation method, and compared with the result obtained by the former third calculation method. The method of deriving the image function by the second calculation method will be explained in detail in the second and third embodiments, so only the result will be explained. Pitch sampling on this image plane is as shown in FIG. 3D. Pitch sampling is obtained from a distribution representing the pattern periodicity, as will be described later. The periodicity is obtained by extracting bright peak positions from this distribution. However, in a phase-shift mask, the periodicity may be obtained by extracting dark peak positions, since dark peaks are notable. Referring to FIG. 3D, ● indicates a bright peak position, and ○ indicates a dark peak position. The periodicity is the same either way. A circular distribution was assumed as a function representing the shape of a pattern element.

Figure 3E:
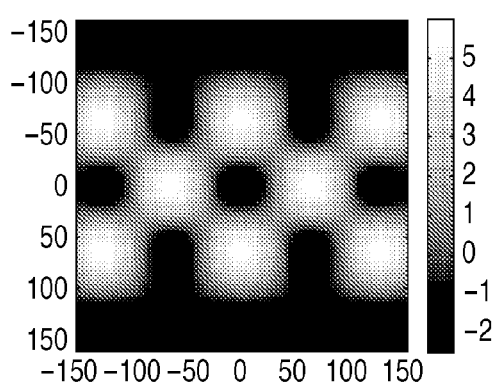
Figure 3F:
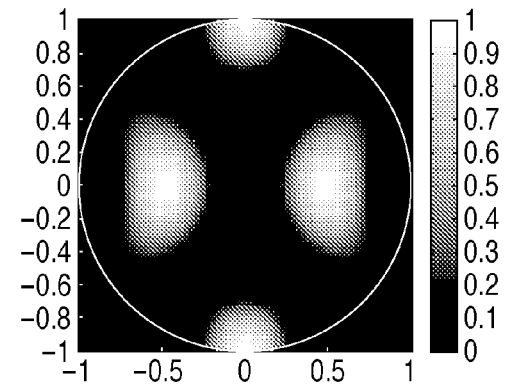

FIG. 3E shows the calculated image function. In all of the drawings showing pitch sampling on the image plane such as FIG. 3D and the drawings showing the image function such as FIGS. 3B and 3E, the ordinate and abscissa are indicated by the length (nm) on the image plane. The computer divided the image function by the impulse response, performed inverse Fourier transform on the divided function, and divided the result by the complex conjugate function of the pupil function. Then, the computer calculated the effective light source as all negative intensities are zeros. FIG. 3F shows the calculated effective light source. In FIGS. 3C and 3F, the ordinate and abscissa represent coordinates on the normalized pupil plane.

Comparison of the image functions calculated by the second and third methods reveals that very similar distributions are obtained by increasing the resolution of an image by increasing the number of pixels. Accordingly, the light source distributions shown in FIGS. 3C and 3F are very similar. When the two light source distributions were checked by image formation simulation, the performances were almost equal.

Figure 4A:
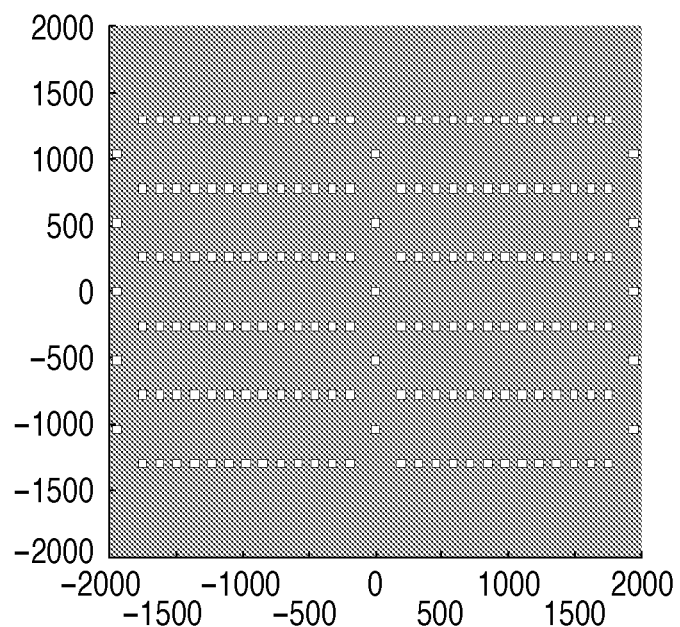
FIGS. 4A and 4B are views showing a mask pattern and the two-dimensional image of an aerial image obtained by using the effective light source according to the first embodiment.
Figure 4B:
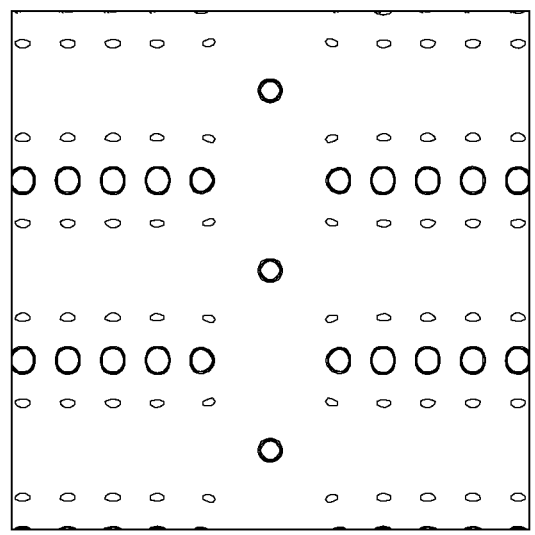

The effect will now be verified by image formation simulation by using a mask pattern identical to the target pattern. An image as shown in FIG. 4B was obtained when an image of a mask pattern (FIG. 4A) identical to the target pattern shown in FIG. 3A was formed by illumination light obtained using the effective light source shown in FIG. 3C or 3F as the illumination condition in the exposure apparatus in which exposure light wavelength $\lambda=193$ (nm) and NA=1.35. The polarization distribution of the light source was unpolarized. FIG. 4B shows the contour lines of an intensity distribution using, as slice levels, an intensity value by which the width of the reference pattern in the lateral direction was 65 (nm), and intensity values of ±10% of the former intensity value. Consequently, it was confirmed that the contrast and shape reproducibility were high, and the depth of focus characteristics were also excellent although the results are omitted.

[Second Embodiment]

Figure 5A:
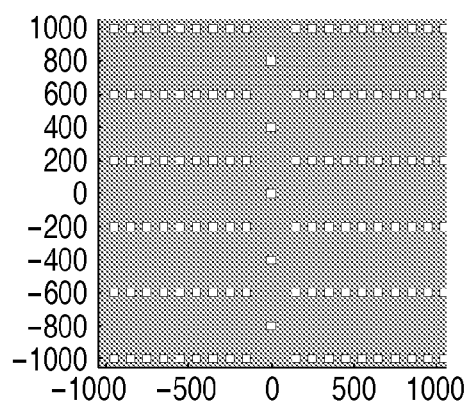
FIGS. 5A to 5F are views showing a target pattern, a diffracted light distribution from the target pattern, pitch sampling, the distribution of a function representing the shape, an image function, and a determined effective light source according to the second embodiment.
Figure 5B:
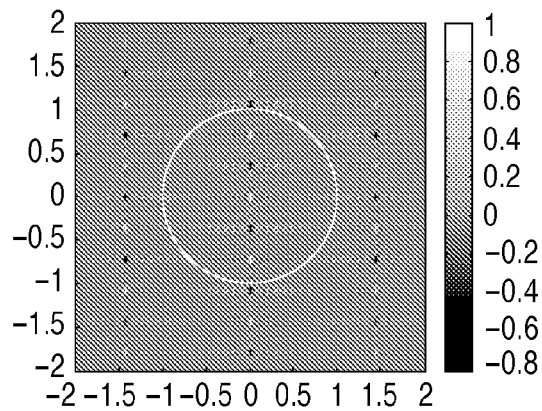
Figure 5C:
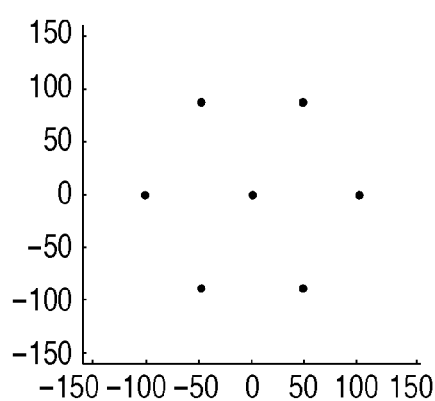
Figure 5D:
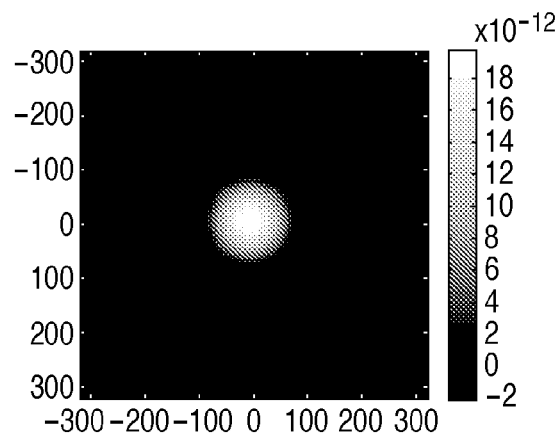
Figure 5E:
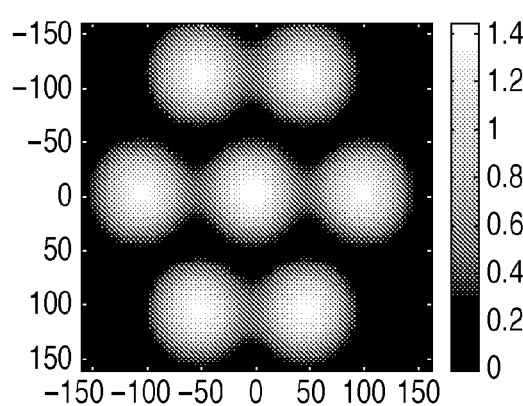
Figure 5F:
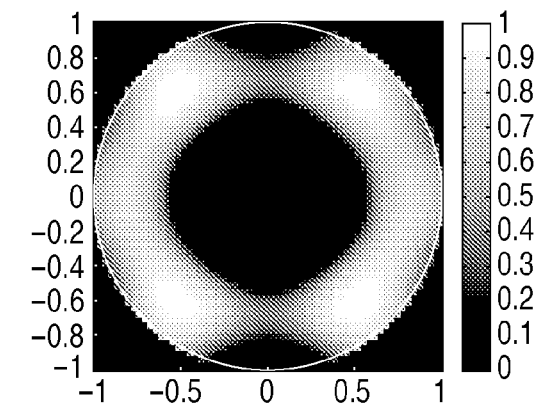

A method of determining an effective light source by using the same pattern example as in the first embodiment will be explained below. FIG. 5A shows a target pattern to be formed on a substrate. The minimum half pitch of the target pattern is HP=50 (nm). That is, since exposure light wavelength $\lambda=193$ (nm) and NA=1.35, the half pitch of the target pattern is $k1=0.35$. A mask was assumed to be a binary mask, the transmittance of the pattern was 1, and that of the periphery of the pattern was zero. FIGS. 5E and 5F illustrate an image function and effective light source derived by the second image function calculation method shown in FIG. 1B. FIG. 5E shows the image function, and FIG. 5F shows the effective light source.

The image function deriving method using the second calculation method will be explained in detail below. To obtain pitch sampling from the target pattern, a computer obtained the diffracted light distribution of the target pattern. FIG. 5B shows the diffracted light distribution of the target pattern. More specifically, the computer extracted diffracted light components equal to or larger than a certain value and having the same phase, and performed Fourier transform by including up to a region of $2NA/\lambda$, thereby obtaining the periodicity on the image plane. Alternatively, the periodicity may be obtained by extracting negative in-phase diffracted light components equal to or smaller than the certain value. The computer obtained peak positions from the Fourier-transformed image of the diffracted light, and extracted sampling points within a set range from these peak positions, thereby obtaining pitch sampling on the image plane. This pitch sampling on the image plane is as shown in FIG. 5C. The ordinate and abscissa of FIG. 5C showing pitch sampling on the image plane are indicated by the length (nm) on the image plane.

Then, the computer calculated an image function. In this embodiment, a circular distribution as shown in FIG. 5D was assumed as a function representing the shape. FIG. 5E shows an image function obtained by convolving this function into pitch sampling. The computer divided the image function by the impulse response, performed inverse Fourier transform on the divided function, and divided the result by the complex conjugate function of the pupil function. The computer calculated an effective light source by regarding all negative intensities as zeros. FIG. 5F shows the calculated effective light source. The ordinates and abscissas of FIGS. 5C to 5E are indicated by the length (nm) on the image plane. The ordinates and abscissas of FIGS. 5B and 5F indicate coordinates on the normalized pupil plane.

Subsequently, a mask pattern for forming an image of the target pattern on the image plane is formed. First, an aerial image obtained when a pattern identical to the target pattern was used as a mask pattern (FIG. 6B) was calculated. The illumination condition was as shown in FIG. 6A. That is, the illumination condition was so-called tangential polarization by which each element of the obtained light source distribution had a polarization direction in the tangential direction. Tangential polarization has a polarization distribution having polarization directions in the directions of arrows shown in FIG. 6A. An image of the mask pattern shown in FIG. 6B was formed by the exposure apparatus in which exposure light wavelength $\lambda=193$ (nm) and NA=1.35. FIG. 6C shows the obtained aerial image. Referring to FIG. 6C, when the mask pattern is identical to the target pattern, the optical proximity effect distorts the hole shape in the longitudinal direction and makes the sizes of isolated portions and dense portions different, thereby deteriorating the balance. To well balance the isolated portions and dense portions, therefore, a mask pattern is formed by correcting the proximity effect exerted on the target pattern shown in FIG. 5A by the effective light source shown in FIG. 5F. This method is disclosed in Japanese Patent Laid-Open No. 2008-040470. For example, a mask pattern is formed by calculating an approximate aerial image from the target pattern and light source by 2D-TCC, deforming the shape of a main pattern (or correcting the bias) based on the approximate aerial image, and adding an auxiliary pattern. FIG. 6D shows the mask pattern thus obtained. An image as shown in FIG. 6E was obtained when an image of the mask pattern shown in FIG. 6D was formed under the illumination condition as shown in FIG. 6A by using the exposure apparatus in which exposure light wavelength $\lambda=193$ (nm) and NA=1.35. FIGS. 6C and 6E illustrate intensity contour lines using, as slice levels, an intensity value by which the width of the reference pattern in the lateral direction is 50 (nm), and intensity values of ±10% of the former intensity value. Also, the ordinates and abscissas of FIGS. 6B and 6D are converted into the length (nm) on the image plane.

In the image obtained on the image plane, the isolated portions and dense portions were well balanced, and both the shape and size were uniform. Although no result is shown, a defocused image makes the difference from the former image significant. The depth was large even when compared with another illumination condition, that is, the quadrupole illumination condition often used as the illumination condition of holes. The light source distribution was previously given in the method of obtaining a mask pattern from a target pattern as disclosed in Japanese Patent Laid-Open No. 2008-040470. When adding this method of obtaining a light source as disclosed in this patent, however, it is possible to directly obtain a light source from a target pattern, and obtain a mask pattern by the method disclosed in Japanese Patent Laid-Open No. 2008-040470. Accordingly, this method is regarded as a method of generating an initial light source for obtaining a mask pattern from a target pattern.

[Third Embodiment]

A method of determining an effective light source by using an example of a brick wall pattern will be explained below. FIG. 7A shows a target pattern to be formed on a substrate. The half pitch of the target pattern in the lateral direction is HP=60 (nm). The half pitch of the target pattern in the lateral direction is HP=60 (nm). The pattern has a width of 60 (nm) and a length of 240 (nm). That is, since exposure light wavelength $\lambda$=193 (nm) and NA=1.35, the minimum half pitch of the target pattern is k1=0.42. A mask was assumed to be a binary mask, the transmittance of the pattern was 1, and that of the periphery of the pattern was zero.

In process 1, an image function was obtained by the second calculation method shown in FIG. 1B. In process 14 of FIG. 1B, as the function representing the shape of an element forming the target pattern, a function when the element shape was assumed to be an elliptic shape and a function when the element shape was assumed to be a circular shape were compared. After the image function was calculated, processes 2 to 4 shown in FIG. 1A were performed to obtain effective light sources. FIG. 7B shows an effective light source when the pattern element was assumed to have an elliptic shape. FIG. 7C shows an effective light source when the pattern element was assumed to have a circular shape.

The way an image of the target pattern was formed by each of these light sources was checked. An image of a mask pattern identical to the target pattern shown in FIG. 7A was formed by an exposure apparatus using each of the effective light sources shown in FIGS. 7B and 7C as an illumination condition. The polarization distribution of the illumination condition was so-called tangential polarization by which each element of the obtained effective light source had a polarization direction in the tangential direction. FIGS. 7D and 7E respectively illustrate two-dimensional images obtained from the effective light sources shown in FIGS. 7B and 7C. FIGS. 7D and 7E illustrate intensity contour lines using, as slice levels, an intensity value by which the width of the reference pattern in the lateral direction is 60 (nm), and intensity values of ±10% of the former intensity value. The intensity distribution (FIG. 7D) obtained from the effective light source shown in FIG. 7B was superior in contrast and shape reproducibility, and also superior in focus characteristics although the results will be omitted. This indicates that when calculating an image function by the second calculation method shown in FIG. 1B, it is important to set a function expressing the shape of a target pattern so that the image function has a proper distribution.

[Fourth Embodiment]

A projection optical system only considers a defocus aberration, and does not consider a resist with which a substrate (wafer) is coated. Let def(unit:nm) be the defocus amount of an image plane. In this case, letting $\Phi$ be an aberration function, by considering an aberration in a pupil function P(f,g) in equation (7) or (8), equation (10) below can be obtained.

$$P(f,g) = \exp[-2\pi i/\lambda \cdot \Phi(f,g)] \quad (10)$$

For example, only considering defocus as an aberration, the aberration function $\Phi$ is expressed by:

$$\Phi(f,g) = \mathrm{def} \cdot n \cdot (1 - \sqrt{1-(NA/n)^2(f^2+g^2)}) \quad (11)$$

where n represents the refractive index of a medium.

When expanded by Zernike coefficients, the aberration function $\Phi$ can be expressed as follows. Assume that the coordinates of a pupil are polar coordinates $(\rho,\theta)$ $(0 \leq \rho \leq 1$ and $0 \leq \theta \leq 2\pi)$.

$$\Phi(\rho, \theta) = A_{00} + \sum_{n=2}^{\infty} A_{n0} R_n^0(\rho) + \sum_{n=1}^{\infty} \sum_{m=1}^{n} A_{nm} R_n^m(\rho) \cos m\theta \quad (12)$$

where n and m are integers, and meets $n \geq m \geq 1$, $A_{nm}$ is a coefficient, and $R_n^m(\rho) \cos m\theta$ is an orthogonal function system.

In this embodiment, an effective light source is determined by using equations (10) and (11). FIG. 9A shows a target pattern to be formed on the substrate. Assume that the minimum half pitch HP of the target pattern is 65 (nm). When normalized by exposure light wavelength $\lambda$=193 (nm) and NA=1.35, the target pattern half pitch is k1=0.45. A mask was assumed to be a halftone phase-shift mask, the transmittance of the pattern was 100%, and that of the periphery of the pattern was 6%. A phase difference between the pattern and the periphery of the pattern is $\pi$ (rad). The ordinate and abscissa of FIG. 9A showing the pattern are indicated by a length (nm) converted into the length on the image plane. In all the drawings, the abscissa is the X-axis, and the ordinate is the Y-axis.

A light source distribution is calculated from the target pattern by considering a defocus aberration. Any of the above-described three calculation methods may be used as an image function calculation method. When using the third calculation method, an approximate aerial image I(x,y) in equation (9) needs to be different from that in a case including no aberration. Assume, however, that they are equal. That is, an image function is obtained by assuming that the approximate aerial image I(x,y) is equal to the target pattern itself or a partial image of the target pattern.

A light source distribution is calculated from the obtained image function by using equation (7) or (8). In this step, an impulse response is obtained by performing Fourier transform on the pupil function of equation (10), and a response length is obtained based on the length to the second zero point of the impulse response. The response length in a case including an aberration is different from that in a case including no aberration.

A case considering a defocus aberration is compared with that not considering a defocus aberration. In this case, def=50 (nm) is set as a defocus amount. As a defocus amount, 50 to 70% of a required depth, that is, 0.5 to $0.7\lambda/NA^2$ is set. Alternatively, an aberration is set so that the central intensity of the impulse response does not become lower than the peripheral intensity. The response length to the second zero point of the impulse response when there is such aberration may be substituted for that when there is no aberration.

FIG. 9B shows a light source distribution calculated from equation (7) (or (8)) by assuming that there is no aberration, that is, $\Phi$=0 in equation (10). FIG. 9C shows a mask pattern obtained from the light source distribution. FIG. 9D shows a light source distribution calculated from equation (7) (or (8)) by considering a defocus aberration, that is, by assuming def=50 (nm) in equation (11). FIG. 9E shows a mask pattern obtained from the light source distribution. By considering a defocus aberration, a light source distribution and mask pattern different from those in a case not considering a defocus aberration are obtained.

The performances are verified by image formation simulation using those light source distributions and mask patterns. In the image formation simulation, an exposure apparatus, in which exposure light wavelength $\lambda$=193 (nm) and NA=1.35, forms an image of the mask pattern shown in FIG. 9C or 9E by illumination light obtained using the effective light source shown in FIG. 9B or 9D as the illumination condition. The image formation simulation was done by changing the defocus amount.

Figure 10:
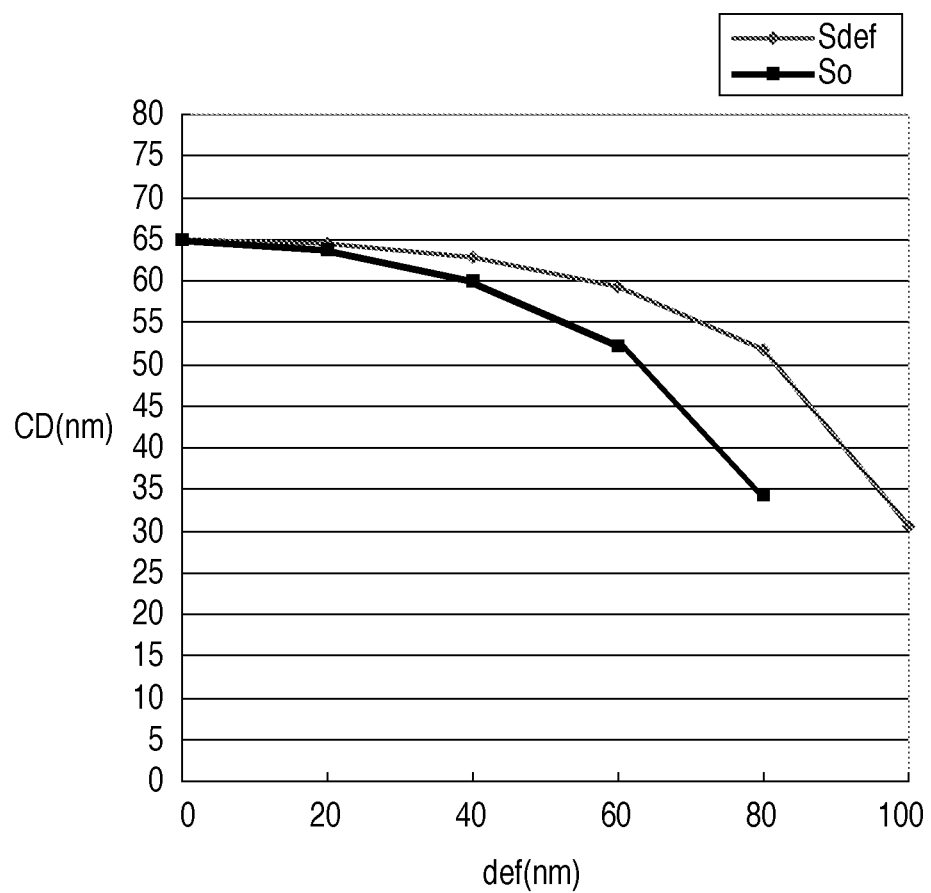
FIG. 10 is a view showing the CD focus characteristics of an aerial image according to the fourth embodiment.

Performance assessment is done by obtaining a change amount in line width (CD) of a two-dimensional image when changing the defocus amount. A value such that the width of a reference pattern in the X direction becomes 65 (nm) is obtained as a reference slice level from an aerial image obtained at the best focus. Then, an aerial image is obtained as a two-dimensional image for each defocus amount by using the contour lines of the reference slice level, thereby obtaining the line width (CD) of the two-dimensional image. In this way, the CD for the defocus amount is obtained, and the image formation performances of the light source considering an aberration and that not considering an aberration are compared. FIG. 10 shows the result. Referring to FIG. 10, black lines indicate the CD obtained from the aerial image obtained from the mask and the light source considering a defocus aberration, and gray lines indicate the CD obtained from the aerial image obtained from the mask and the light source not considering a defocus aberration. As shown in FIG. 10, the light source considering an aberration is less sensitive to a change in focus, that is, superior in focus characteristics. Although the results will be omitted, it has been ensured that the light source considering an aberration is superior in focus characteristics even when using the same mask pattern. This, therefore, means that the light source distribution considering an aberration reduces a decrease in image formation performance due to an aberration. Furthermore, although the light source distribution considering a defocus aberration is shown in this embodiment, it is possible to calculate a light source distribution using an arbitrary aberration function by using equation (12).

[Exposure Apparatus]

Figure 8:
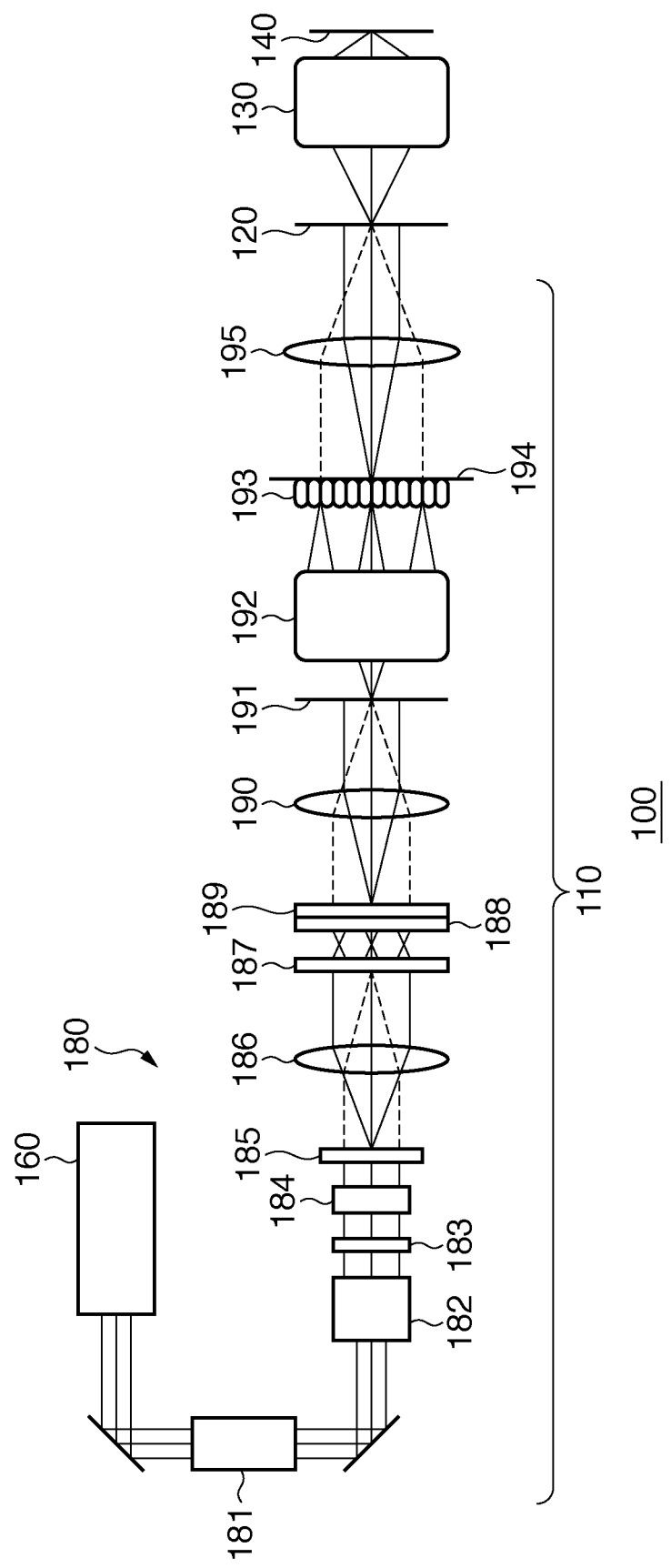
FIG. 8 is a view showing an exposure apparatus.

An exposure apparatus 100 that illuminates an original with light emitted from an illumination optical system and exposes a substrate by projecting a pattern of the illuminated original onto the substrate via a projection optical system will be explained below with reference to FIG. 8. FIG. 8 is a schematic block diagram showing the arrangement of the exposure apparatus 100. In the exposure apparatus 100, an illumination optical system 180 forms an effective light source corresponding to effective light source data generated by executing the generation program described previously. The exposure apparatus 100 illuminates a mask 120 formed based on the light source data generated by executing the above-described generation program. In this embodiment, the exposure apparatus 100 is a projection exposure apparatus that exposes a wafer 140 to the pattern of the mask 120 by the step-and-scan method. However, the exposure apparatus 100 is also applicable to the step-and-repeat method or another exposure method. As shown in FIG. 8, the exposure apparatus 100 includes an illuminating device 110, a reticle stage (not shown) for supporting the mask 120, a projection optical system 130, and a wafer stage (not shown) for supporting the wafer 140. The illuminating device 110 illuminates the mask 120 having a circuit pattern to be transferred, and includes a light source 160 and the illumination optical system 180. The light source 160 is an excimer laser such as an ArF excimer laser having a wavelength of about 193 nm, or a KrF excimer laser having a wavelength of about 248 nm. However, the light source 160 is not limited to the excimer laser, and can also be an F2 laser having a wavelength of about 157 nm, a narrow-band mercury lamp, or the like.

The illumination optical system 180 is an optical system for illuminating the mask 120 by using light from the light source 160. In this embodiment, the illumination optical system 180 illuminates the mask 120 by forming an effective light source corresponding to the effective light source data generated by executing the above-described generation program. The illumination optical system 180 includes a relay optical system 181, an optical system 182 for shaping a beam, a polarization controller 183, a phase controller 184, an optical element 185 for saving the exit angle, a relay optical system 186, and a multi-beam generator 187. The illumination optical system 180 also includes a polarization state adjusting unit 188, computer hologram 189, relay optical system 190, aperture 191, zoom optical system 192, multi-beam generator 193, aperture stop 194, and irradiation unit 195. The relay optical system 181 deflects the light from the light source 160, and guides the deflected light to the optical system 182 for shaping a beam. The optical system 182 for shaping a beam converts the aspect ratio of the dimensions of the sectional shape of the light from the light source 160 into a desired value (for example, changes the sectional shape from a rectangle to a square), thereby shaping the sectional shape of the light from the light source 160 into a desired shape. The optical system 182 for shaping a beam forms a light beam having a size and divergence angle required to illuminate the multi-beam generator 187.

The polarization controller 183 includes a linear polarizer or the like, and has a function of removing unnecessary polarization components. By minimizing polarization components to be removed (shielded) by the polarization controller 183, the light from the light source 160 can efficiently be converted into desired linearly polarized light. The phase controller 184 converts the linearly polarized light obtained by the polarization controller 183 into circularly polarized light by giving a phase difference of $\lambda/4$ to the linearly polarized light. The optical element 185 for saving the exit angle includes, for example, an optical integrator (a fly-eye lens made up of a plurality of microlenses, a fiber bundle, or the like), and outputs light at a predetermined divergence angle. The relay optical system 186 concentrates the exit light from the optical element 185 for saving the exit angle to the multi-beam generator 187. The relay optical system 186 gives the Fourier transform relationship (the relationship between an object plane and pupil plane or between the pupil plane and an image plane) to the exit surface of the optical element 185 for saving the exit angle and the incident surface of the multi-beam generator 187. The multi-beam generator 187 includes an optical integrator (a fly-eye lens made up of a plurality of microlenses, a fiber bundle, or the like) for uniformly illuminating the polarization state adjusting unit 188 and computer hologram 189. The exit surface of the multi-beam generator 187 forms a light source surface made up of a plurality of point light sources. The existing light from the multi-beam generator 187 enters, as circularly polarized light, the polarization state adjusting unit 188.

The polarization state adjusting unit 188 converts the circularly polarized light obtained by the phase controller 184 into linearly polarized light having a desired polarization direction by giving a phase difference of $\lambda/4$ to the circularly polarized light. The exit light from the polarization state adjusting unit 188 enters, as linearly polarized light, the computer hologram 189 as a diffraction optical element. The polarization state adjusting unit 188 is placed closer to the light source side than the computer hologram 189, but may be placed on the opposite side. It is also possible to form the polarization state adjusting unit as an SWS (Sub Wavelength Structure), and integrate the SWS with the diffraction optical element. That is, one element can be formed to have the functions of both the polarization state adjusting unit and diffraction optical element. When circularly polarized light enters, light having passed through the polarization state adjusting unit 188 is converted into linearly polarized light having a desired polarization direction, and this linearly polarized light enters a predetermined portion of the computer hologram 189, thereby forming an arbitrary light source distribution having an arbitrary polarization direction (see FIG. 5B).

The computer hologram 189 forms a desired light intensity distribution such as an effective light source having tangential polarization, at the position of the aperture 191 via the relay optical system 190. The computer hologram 189 can also form annular illumination, quadrupole illumination, and the like, and can achieve a desired polarization distribution such as tangential polarization or radial polarization together with the polarization state adjusting unit 188. A plurality of computer holograms 189 for forming different effective light sources are arranged in a switching unit such as a turret. The polarization state adjusting unit 188 is also changeable. Various kinds of effective light sources can be implemented by arranging, in the optical path of the illumination optical system 180, the computer holograms 189 corresponding to the effective light source data generated by a processing apparatus described above.

The aperture 191 has a function of passing only the light intensity distribution formed by the computer hologram 189. The computer hologram 189 and aperture 191 are arranged to have the relationship of the Fourier transform plane. The zoom optical system 192 enlarges the light intensity distribution formed by the computer hologram 189 by a predetermined magnification, and projects the enlarged distribution onto the multi-beam generator 193. The multi-beam generator 193 is placed on the pupil plane of the illumination optical system 180, and forms, on the exit surface, a light source image (effective light source distribution) corresponding to the light intensity distribution formed at the position of the aperture 191. In this embodiment, the multi-beam generator 193 is an optical integrator such as a fly-eye lens or cylindrical lens array. Note that the aperture stop 194 is formed near the exit surface of the multi-beam generator 193. The irradiation unit 195 includes a condenser optical system, and illuminates the mask 120 with the effective light source distribution formed on the exit surface of the multi-beam generator 193.

The mask 120 is formed based on mask data generated by the processing apparatus described previously, and has a circuit pattern (main pattern) to be transferred and an auxiliary pattern. The mask 120 is supported and driven by the mask stage (not shown). Diffracted light emitted from the mask 120 is projected onto the wafer 140 via the projection optical system 130. Since the exposure apparatus 100 is a step-and-scan type exposure apparatus, the pattern of the mask 120 is transferred onto the wafer 140 by scanning the mask 120 and wafer 140. The projection optical system 130 is an optical system for projecting the pattern of the mask 120 onto the wafer 140. A refracting system, cata-dioptric system, or reflecting system can be used as the projection optical system 130. The wafer 140 is a substrate onto which the pattern of the mask 120 is to be projected (transferred), and is supported and driven by the wafer stage (not shown). However, it is also possible to use a glass plate or another substrate instead of the wafer 140. The wafer 140 is coated with a photoresist. During exposure, the illumination optical system 180 illuminates the mask 120 with the light emitted from the light source 160. The projection optical system 130 forms, on the wafer 140, an image of the light reflecting the pattern of the mask 120. In this step, the mask 120 formed based on the mask data generated by the above-described processing apparatus is illuminated with the effective light source corresponding to the effective light source data generated by the processing apparatus.

Accordingly, the exposure apparatus 100 can economically provide high-quality devices (for example, a semiconductor element, an LCD element, an image sensing element (such as a CCD), and a thin-film magnetic head) with a high throughput by multiple exposure.

[Device Manufacturing Method]

A method of manufacturing a device (for example, a semiconductor device or liquid crystal display device) of an embodiment of the present invention will be explained below. A semiconductor device manufacturing method will be explained as an example. A semiconductor device is manufactured through a pre-process of forming an integrated circuit on a wafer, and a post-process of completing, as a product, the integrated circuit chip on the wafer formed in the pre-process. The pre-process includes a step of exposing a wafer coated with a photosensitive agent by using the above-described exposure apparatus, and a step of developing the wafer. The post-step includes assembling steps (dicing and bonding), and a packaging step (encapsulation). Note that a liquid crystal display device is manufactured through a step of forming a transparent electrode. The step of forming a transparent electrode includes a step of applying a photosensitive agent onto a glass substrate on which a transparent conductive film is deposited, a step of exposing the glass substrate coated with the photosensitive agent by using the above-described exposure apparatus, and a step of developing the glass substrate. The device manufacturing method of this embodiment can manufacture a device superior in quality to the conventional devices.

[Other Embodiments]

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (for example, computer-readable medium). In such a case, the system or apparatus, and the recording medium where the program is stored, are included as being within the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-265530, filed Nov. 20, 2009 and No. 2010-240106, filed Oct. 26, 2010, which are hereby incorporated by reference herein in their entirety.

What is claimed is:

1. A non-transitory computer readable storage medium storing a program executable by a computer to execute a method of calculating a light intensity distribution to be formed on a pupil plane of an illumination optical system in an exposure apparatus which illuminates an original with light emitted from said illumination optical system, and exposes a substrate by projecting a pattern of the illuminated original onto the substrate via a projection optical system, the method comprising the steps of:

determining an impulse response function of said projection optical system through a process of performing Fourier transform on a pupil function of said projection optical system;

setting a length to a second zero point of the impulse response function from the origin as a response length, extracting, from elements forming a target pattern to be formed on the substrate, only elements for each of which the spacing to an adjacent element is equal to or smaller than the response length, and determining a function indicating the extracted pattern as an image function; and obtaining the light intensity distribution to be formed on the pupil plane of said illumination optical system based on the pupil function, the determined impulse response function, and the determined image function.

2. The non-transitory computer readable storage medium according to claim 1, wherein the pupil function includes an aberration of said projection optical system.

3. The non-transitory computer readable storage medium according to claim 1, wherein the step of obtaining the light intensity distribution comprises the steps of:

executing a division process of dividing the determined image function by the impulse response function, and performing inverse Fourier transform on the function having performed the division process; and obtaining the light intensity distribution to be formed on the pupil plane of the illumination optical system by performing a division process of dividing the function having performed inverse Fourier transform by a complex conjugate function of the pupil function.

4. The non-transitory computer readable storage medium according to claim 1, wherein letting $\lambda$ be a wavelength of the light which illuminates the original, and NA be a numerical aperture of said projection optical system, the step of determining the impulse response function comprises, after performing Fourier transform on the pupil function, the step of replacing coordinates on an image plane of said projection optical system with coordinates on the pupil plane of said projection optical system by dividing the coordinates on the image plane by (NA/$\lambda$), and replacing a nonzero value at a point at which an impulse response function is zero.

5. A non-transitory computer readable storage medium storing a program executable by a computer to execute a method of calculating a light intensity distribution to be formed on a pupil plane of an illumination optical system in an exposure apparatus which illuminates an original with light emitted from said illumination optical system, and exposes a substrate by projecting a pattern of the illuminated original onto the substrate via a projection optical system, the method comprising the steps of:

determining an impulse response function of said projection optical system through a process of performing Fourier transform on a pupil function of said projection optical system;

setting a length to a second zero point of the impulse response function from the origin as a response length, extracting a pattern from elements forming a target pattern to be formed on the substrate, and determining a function indicating the extracted pattern as an image function; and obtaining the light intensity distribution to be formed on the pupil plane of said illumination optical system based on the pupil function, the determined impulse response function, and the determined image function, wherein the step of determining the image function comprises the steps of:

calculating a diffracted light distribution of the target pattern to be formed on the substrate;

extracting diffracted light components having the same phase from the calculated diffracted light distribution;

performing Fourier transform on the extracted diffracted light components;

obtaining a function of peak positions of the diffracted light components having performed Fourier transform, within a range enclosed with a circle centering around an optical axis of said projection optical system and having a diameter not more than the response length; and convolving a function representing a shape of an element forming the target pattern into the obtained function of peak positions, and determining the convolved function as an image function.

6. A non-transitory computer readable storage medium storing a program executable by a computer to execute a method of calculating a light intensity distribution to be formed on a pupil plane of an illumination optical system in an exposure apparatus which illuminates an original with light emitted from said illumination optical system, and exposes a substrate by projecting a pattern of the illuminated original onto the substrate via a projection optical system, the method comprising the steps of:

determining an impulse response function of said projection optical system through a process of performing Fourier transform on a pupil function of said projection optical system;

setting a length to a second zero point of the impulse response function from the origin as a response length, extracting a pattern from elements forming a target pattern to be formed on the substrate, and determining a function indicating the extracted pattern as an image function; and obtaining the light intensity distribution to be formed on the pupil plane of said illumination optical system based on the pupil function, the determined impulse response function, and the determined image function, wherein letting I(x,y) be an image of the target pattern to be formed on the substrate, a(f,g) be a diffracted light distribution of the target pattern at a point (f,g) on the pupil plane of said projection optical system, F be Fourier transform, and $F^{-1}$ be inverse Fourier transform, the step of determining the image function comprises the step of calculating an image function r(x,y) by substituting the image I(x,y) of the target pattern and the diffracted light distribution a(f,g) of the target pattern into a right side of $$r(x, y) = F\left[\frac{1}{a(f, g)} F^{-1}\left[\frac{I(x, y)}{F[a(f, g)]}\right]\right]$$

and replacing with zero a value of the image function for which a distance from an optical axis of said projection optical system is larger than the response length.

7. A method of calculating a light intensity distribution to be formed on a pupil plane of an illumination optical system in an exposure apparatus which illuminates an original with light emitted from the illumination optical system and exposes a substrate by projecting a pattern of the illuminated original onto the substrate via a projection optical system, the method, which is executable by a computer, comprising the steps of:

determining an impulse response function of the projection optical system through a process of performing Fourier transform on a pupil function of the projection optical system;

setting a length from the origin to a second zero point of the impulse response function as a response length, extracting, from elements forming a target pattern to be formed on the substrate, only elements for each of which the spacing to an adjacent element is equal to or smaller than the response length, and determining a function indicating the extracted pattern as an image function; and obtaining the light intensity distribution to be formed on the pupil plane of the illumination optical system based on the pupil function, the determined impulse response function, and the determined image function.

8. The method according to claim 7, wherein the pupil function includes an aberration of the projection optical system.

9. The method according to claim 7, further comprising the steps of:

executing a division process of dividing the determined image function by the impulse response function, and performing inverse Fourier transform on the function having performed the division process; and obtaining the light intensity distribution to be formed on the pupil plane of the illumination optical system by performing a division process of dividing the function having performed inverse Fourier transform by a complex conjugate function of the pupil function.

10. A method of calculating a light intensity distribution to be formed on a pupil plane of an illumination optical system in an exposure apparatus which illuminates an original with light emitted from the illumination optical system and exposes a substrate by projecting a pattern of the illuminated original onto the substrate via a projection optical system, the method, which is executable by a computer, comprising the steps of:

determining an impulse response function of the projection optical system through a process of performing Fourier transform on a pupil function of the projection optical system;

setting a length from the origin to a second zero point of the impulse response function as a response length, extracting a pattern from elements forming a target pattern to be formed on the substrate, and determining a function indicating the extracted pattern as an image function; and obtaining the light intensity distribution to be formed on the pupil plane of the illumination optical system based on the pupil function, the determined impulse response function, and the determined image function, wherein the step of determining the image function comprises the steps of:

calculating a diffracted light distribution of the target pattern to be formed on the substrate;

extracting diffracted light components having the same phase from the calculated diffracted light distribution;

performing Fourier transform on the extracted diffracted light components;

obtaining a function of peak positions within a area of not more than the response length; and convolving a function representing a shape of an element forming the target pattern into the obtained peak position function, and determining the convolved function as an image function.

11. A method of calculating a light intensity distribution to be formed on a pupil plane of an illumination optical system in an exposure apparatus which illuminates an original with light emitted from the illumination optical system and exposes a substrate by projecting a pattern of the illuminated original onto the substrate via a projection optical system, the method, which is executable by a computer, comprising the steps of:

determining an impulse response function of the projection optical system through a process of performing Fourier transform on a pupil function of the projection optical system;

setting a length from the origin to a second zero point of the impulse response function as a response length, extracting a pattern from elements forming a target pattern to be formed on the substrate, and determining a function indicating the extracted pattern as an image function; and obtaining the light intensity distribution to be formed on the pupil plane of the illumination optical system based on the pupil function, the determined impulse response function, and the determined image function, wherein letting $r(x,y)$ be the image function, $I(x,y)$ be an image of the target pattern to be formed on the substrate, $a(f,g)$ be a diffracted light distribution of the target pattern at a point $(f,g)$ on the pupil plane of the projection optical system, F be Fourier transform, and $F^{-1}$ be inverse Fourier transform, the step of determining the image function comprises the step of calculating the image function $r(x,y)$ by substituting the image $I(x,y)$ of the target pattern and the diffracted light distribution $a(f,g)$ of the target pattern into a right side of $$r(x, y) = F\left[\frac{1}{a(f, g)} F^{-1}\left[\frac{I(x, y)}{F[a(f, g)]}\right]\right]$$

and replacing with zero a value of the image function for which a distance from an optical axis of the projection optical system is larger than the response length.

* * * * *